United States Patent [19]

Nagayama et al.

[11] Patent Number: 5,268,070
[45] Date of Patent: Dec. 7, 1993

[54] DRY ETCHING METHOD

[75] Inventors: Tetsuji Nagayama; Shingo Kadomura, both of Kanagawa, Japan

[73] Assignee: Sony Corporation, Tokyo, Japan

[21] Appl. No.: 824,165

[22] Filed: Jan. 22, 1992

[30] Foreign Application Priority Data

Jan. 22, 1991 [JP] Japan .................. 3-020361

[51] Int. Cl.$^5$ .......................................... H01L 21/00
[52] U.S. Cl. ................................. 156/662; 156/643; 156/646; 156/653
[58] Field of Search ............... 156/646, 662, 643, 657, 156/653

[56] References Cited

U.S. PATENT DOCUMENTS 4,807,016  2/1989  Douglas .............................. 156/643

FOREIGN PATENT DOCUMENTS 55-036980  3/1980  Japan .
63-181430  7/1988  Japan .
01-008628  1/1989  Japan .
01-032627  2/1989  Japan .
02-309631  12/1990  Japan .

Primary Examiner—Brian E. Hearn
Assistant Examiner—George Goudreau
Attorney, Agent, or Firm—Hill, Steadman & Simpson

[57] ABSTRACT

A dry etching method for silicon trench etching in which high anisotropy, high etchrate and low pollution may be achieved simultaneously. A single crystal silicon substrate is etched using a gas mixture of $S_2Cl_2$ and $S_2F_2$ while a wafer is cooled to about $-70°$ C. Etching proceeds by a mechanism in which a radical reaction by Cl* derived from $S_2Cl_2$ and F* derived from $S_2F_2$ is assisted by the incident energy of $S^+$, $SF^+$, $SCl^+$ or $Cl^+$ ions. The highly reactive F* radicals of a small atomic radius contribute to increasing the etchrate. Deposition of sulfur yielded from $S_2Cl_2$ and $S_2F_2$ provides for efficient sidewall protection to achieve high anisotropy. The conventional practice to add fluorine based gases with a view to increasing the etchrate is in need of an excess quantity of a deposition material to give rise to increased pollution by particles. There is no risk of pollution with the sulfur deposit according to the present invention because the sulfur deposit may easily be sublimed off by heating the wafer.

7 Claims, 1 Drawing Sheet

DRY ETCHING METHOD

BACKGROUND OF THE INVENTION

1. Field of the Invention

This invention relates to a dry etching method employed for the preparation of semiconductor devices. More particularly, it relates to a dry etching method for performing high aspect ratio processing, such as silicon trench etching, with satisfactory anisotropy.

2. Description of Related Art

In keeping up with the high integration and high performance of semiconductor devices, such as VLSIs or ULSIs, the aspect ratio of various patterns in the semiconductor devices tends to be increased acutely. Thus, in the field of dry etching, there is a keen demand for a technology of performing high aspect ratio processing with satisfactory anisotropy.

A typical example of high aspect ratio processing of the layer of the silicon based material is silicon trench etching aimed at forming capacitative elements or device isolation. Trench depth varies depending on the device type and usage and is of the order of 4 to 5 $\mu m$, 1 $\mu m$ and 4 $\mu m$ for capacitative elements, device isolation for MOS transistors, and device isolation for bipolar transistors, respectively. The aperture diameter is of the order of 0.35 to 1.0 $\mu m$ in each case. With silicon trench etching, the cross-sectional shape of the trench is changed in a complex manner depending on mask patterns or etching parameters to present difficulties in trench filling or capacitance control to be performed in subsequent steps. Therefore, if fluorine based gases, with which etching proceeds mainly on the basis of radical reactions, are used for etching, difficulties are raised in achieving high anisotropy. For this reason, chlorine based gases, as typified by a gas mixture of $SiCl_4$ and $N_2$, are employed. With this gas mixture, $Cl^*$ are generated as a main etchant from $SiCl_4$ while $N_2$ is used for deposition of $Si_xN_yCl_z$ which is used for sidewall protection for achieving high anisotopy. The present Assignee has previously proposed adding fluorine based gases capable of generating $F^*$, such as $ClF_3$, to the above gas system, in an amount which is not obstructive to anisotopy, with a view to elevating the etchrate which is determined by the reaction between $Cl^*$ and single crystal silicon.

Meanwhile, low pollution is also demanded of dry etching, besides high anisotropy and high etchrate, as mentioned previously. Above all, in silicon trench etching, for which prolonged processing time is required, how to suppress particle generation during etching is crucial. Thus, for reducing pollution, it is desirable to diminish the generation of reaction products, such as $Si_xN_yCl_z$. However, in this case, anisotropy would be deteriorated because the effects of the fluorine based gases, added for increasing the etchrate, would be demonstrated pronouncedly.

The present Assignee has also proposed a technique of etching a layer of a silicon based material using an etching gas consisting mainly of sulfur chloride, such as $S_2Cl_2$, or sulfur bromide, such as $S_2Br_2$, as a gas system effective to suppress pollution by the particles. With this technique, anisotropy may be attained through sidewall protection and suppression of radical reaction which may be achieved by low temperature etching. If, for example, $S_2Br_2$, is used, sidewall protection may be attained by a deposit mainly composed of sulfur dissociated from $S_2Br_2$ and also containing $SiBr_x$ which is an etching reaction product. This deposit may easily be removed by sublimation or vaporization by heating the etched substrate to approximately 90° to 150° C. after completion of etching, so that there is no risk of pollution by the particles. Despite such an advantage, the etchrate is generally low with the prior art technique because the rate of the etching reaction itself is determined by the ion assist reaction by $Cl^+$ or $Br^+$.

Thus a demand has been raised for a more excellent process in view of the difficulties encountered in simultaneously satisfying the requirements for high anisotropy, high etchrate and low pollution.

OBJECT AND SUMMARY OF THE INVENTION

It is an object of the present invention to provide a dry etching method of etching a layer of a silicon based material which method will satisfy the above requirements simultaneously.

As an approach to achieving high anisotropy, high etchrate and low pollution simultaneously, the present inventors have arrived at a concept of elevating the etchrate by the presence in the reaction system of a small amount of $F^*$ while intensive sidewall protection is assured by sublimable substances. Thus the present inventors have reached the concept of using a sulfur fluoride-sulfur chloride mixture as the etching gas composition.

Among the compounds thought to be useful as sulfur fluorides are $S_2F_2$, $SF_2$, $SF_4$ and $S_2F_{10}$. Besides, $SF_6$ is also known as a stable sulfur fluoride compound and put to practical application as a dry etching gas. However, it has been demonstrated that the compound has a low S/F ratio (the ratio of the number of sulfur atoms to that of fluorine atoms in one molecule) and hence generates a large quantity of $F^*$ radicals, while it can hardly generate sulfur on dissociation by electrical discharge, so that this compound may not be used for the purpose of the present invention.

Among the compounds thought to be useful as sulfur chlorides, on the other hand, there are $S_3Cl_2$, $S_2Cl_2$ and $SCl_2$.

Both the sulfur fluorides and the sulfur chlorides are capable of generating free sulfur in a plasma on dissociation by electrical discharge. Sulfur generated in this manner is easily precipitated on the substrate surface, depending on the operating conditions, if the substrate has been cooled to approximately below ambient or room temperature. Sulfur deposited on the ion incident surface may be readily sputtered off, whereas it continues to be deposited on the pattern sidewall where a lesser amount of ions are incident and where the sulfur functions as a sidewall protection film. Besides, high anisotropy is also assured because the substrate is cooled to a lower temperature and hence the radical reaction is suppressed to some extent. In addition, the deposited sulfur may easily be sublimed or burnt off by heating or processing the substrate with an oxygen plasma treatment after the completion of etching, so that, as a most crucial merit of the present invention, there is the least risk of pollution by the particles.

On the other hand, $Cl^*$ derived from sulfur chlorides of $F^*$ derived from sulfur fluorides contribute to the etching of the layer of the silicon based material. The reaction by these radicals is assisted by the incident energy of the $S^+$, $SF^+$, $SCl^+$ or $Cl_x^+$ ions. Among these, $F^*$ radicals are lesser in radius and may be intruded easily into the crystal lattices of single crystal silicon to expedite the chemical reaction, so that they may be said to be a highly reactive chemical species. For this reason, if sulfur fluorides are added to the gas mixture to supply F* to the etching system, the etchrate may be higher than when only chlorine based ions are used.

Although attempts have been made in adding fluorine based gases for increasing the etchrate, it becomes necessary in this case to provide for intensive sidewall protection for assuring anisotropy, as a result of which pollution by particles is produced inevitably. The present invention is exempt from this problem because sulfur may be supplied from both sulfur chlorides and sulfur fluorides to provide for intensive sidewall protection and, besides, the deposited sulfur may be easily sublimed off. In addition, since Br is not contained in the etching gas employed in the present invention, there is no risk of pollution or the microloading effects brought about by an excess deposition of $SiBr_x$.

In this manner, in accordance with the present invention, high anisotropy, high etchrate and low pollution may be achieved simultaneously.

Thus the present invention is highly useful in the preparation of semiconductor devices exhibiting high integration and high performance in conformity to the refined design rule.

BRIEF DESCRIPTION OF THE DRAWINGS

FIGS. 1a and 1b are schematic cross-sectional views showing the dry etching method of the present invention when applied to silicon trench etching, step by step, wherein FIG. 1a shows the state of a wafer prior to etching and FIG. 1b shows the state of the wafer after the end of etching.

DETAILED DESCRIPTION OF THE INVENTION

Figure 1A:
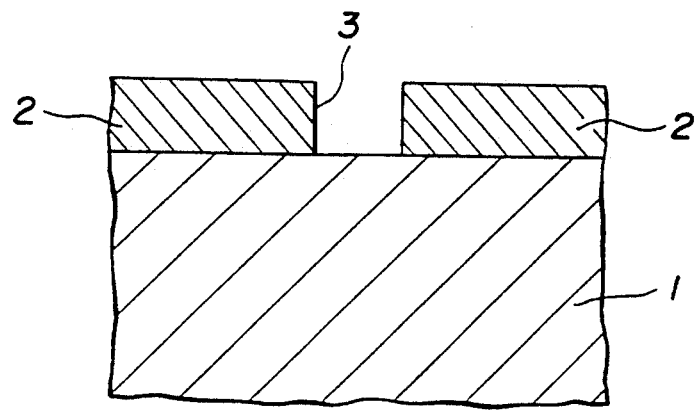
Figure 1B:
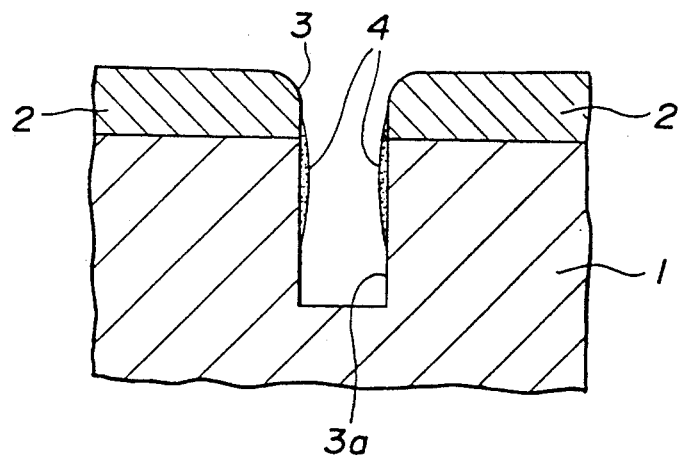

Referring to FIGS. 1a and 1b, preferred embodiments of the present invention will be explained in detail.

In the present embodiment, silicon trench etching was performed using a gas mixture of $S_2F_2$ as a sulfur fluoride and of $S_2Cl_2$ as a sulfur chloride.

First, as shown in FIG. 1a, a substrate to be etched, or a wafer, including a silicon substrate 1 and a silicon oxide etching mask 2 formed thereon, was prepared. An aperture 3 about 0.5 μm in diameter, was previously formed by patterning on the etching mask 2.

The wafer was set in a magnetic microwave plasma etching device and cooled to about $-70°$ C. by circulating a cooling medium, such as ethanol, through a cooling conduit enclosed within a wafer setting electrode. The silicon substrate 1 was etched under the conditions of a $S_2F_2$ flow rate of 5 SCCM, a $S_2Cl_2$ flow rare of 20 SCCM, a gas pressure of 1.3 Pa (10 mTorr), a microwave power of 850 W and an RF bias power of 100 W (2 MHz).

These etching conditions have been selected for generating $S^+$, $SCl^+$, $Cl_x^+$ and $SF^+$ ions in the plasma by discharge dissociation of $S_2Cl_2$ and $S_2F_2$, and for achieving high anisotropy by applying a high bias voltage under a low gas pressure. Thus the etching proceeded on the basis mainly of the ion assist reaction, at the same time that F* yielded by discharge dissociation of $S_2F_2$ produced a radical reaction to contribute to etching. Thus the high etchrate of approximately 0.5 μm/min was achieved.

In addition, with the present etching reaction system, sulfur yielded by discharge dissociation from both $S_2F_2$ and $S_2Cl_2$ was contacted with the wafer cooled to an extremely low temperature and was deposited on the pattern sidewall to form a sidewall protection film 4 as shown in FIG. 1b. Meanwhile, with a process in which processing is performed for an extended time under conditions of high incidention energy, such as with trench etching, the edge of the etching mask 2 tends to be retracted and rounded with the progress of the etching. If an aperture with an extremely small diameter in excess of the limit of the resolution of the photolithography is necessitated, a sidewall is occasionally formed in the etching mask 2 by etchback with reactive ion etching (RIE). If the mask edge is rounded in this manner, ions incident thereon tend to be scattered and converted into oblique incident components which then attack pattern sidewall sections to produce unusual shapes such as undercuts or bowing. In accordance with the present invention, since effective sidewall protection may be achieved by the sulfur as described above, a trench 3a with highly satisfactory anisotropic shape may be formed even with etching to a depth of 4 μm.

The sidewall protection film 4 may be sublimed off by heating the wafer to 90° C. or higher after the end of the etching so that no pollution by the particles was produced within the etching system. This heating may be achieved simultaneously by heating mainly intended for preventing dewing after low temperature etching.

It is to be noted that the present invention is not limited to the above described embodiment. For example, a variety of addition gases may be added to the etching gas. For example, $N_2$ may be added in expectation of intensive sidewall protection by reaction products. Alternatively, $H_2$, $H_2S$ or silane-based gases, which are capable of supplying H* and/or silicon based active species to the etching system, may be added for capturing excess halogen radicals for promoting sulfur deposition. Rare gases, such as He or Ar, may also be added for improving sputtering, cooling or diluting effects.

With the above described process for silicon trench etching, it is intended, as premises, to form so-called deep trenches for producing capacitative elements. However, it may also be applied to formation of so-called shallow trenches used for device isolation in the preparation of MOS transistors. In this case, a wafer having a substrate structure similar to that in the gate process is etched using an organic resist material layer as a mask. Thus the sulfur deposited on the pattern sidewall may be removed for the first time by heating the wafer and ultimately by ashing which was originally intended for eliminating the organic resist material.

What is claimed is:

1. A dry etching method for forming a trench in a silicon substrate comprising the steps of providing a substrate of silicon-based material with a surface portion exposed, controlling the temperature of the wafer to be not higher than room temperature, providing an etching gas consisting essentially of at least one sulfur chloride selected from a group consisting of $S_3Cl_2$, $S_2Cl_2$ and $SCl_2$ and at least one sulfur fluoride selected from a group consisting of $S_2F_2$, $SF_2$, $SF_4$ and $S_2F_{10}$, plasma etching the exposed surface of the silicon to form a trench therein and depositing sulfur on side walls of the trench.

2. A dry etching method as claimed in claim 1 wherein at least one compound selected from the group of $H_2$, $H_2S$ and silane-based compounds is added to said etching gas.

3. A dry etching method as claimed in claim 2 wherein deposited sulfur is removed by heating the wafer after the end of etching.

4. A dry etching method according to claim 1, which includes subsequent to completing the etching step, removing the deposited sulfur by heating the wafer.

5. A dry etching method according to claim 4, wherein the step of heating the wafer heats the wafer to a temperature of about 90° C.

6. A dry etching method for forming a trench in a layer of silicon-based material comprising the steps of providing a wafer having a layer of silicon-based material with a surface portion exposed; controlling the temperature of the wafer to be not higher than room temperature; providing an etching gas consisting essentially of at least one sulfur chloride selected from a group consisting of $S_3Cl_2$, $S_2Cl_2$ and $SCl_2$ and at least one sulfur fluoride selected from a group consisting of $S_2F_2$, $SF_2$, $SF_4$ and $S_2F_{10}$; creating a plasma and etching the exposed layer of silicon to form a trench in the exposed surface portion while depositing sulfur on side walls of the trench.

7. A dry etching method according to claim 6, which includes, subsequent to completing the etching of the trench, removing the deposited sulfur by heating the wafer to about 90° C.

* * * * *